United States Patent
MacLeod et al.

(10) Patent No.: US 8,444,129 B2
(45) Date of Patent: May 21, 2013

(54) METHODS OF VERIFYING EFFECTIVENESS OF A PUT OF A SUBSTRATE ONTO A SUBSTRATE SUPPORT

(75) Inventors: Douglas MacLeod, Los Altos, CA (US); Dhruv Gajaria, Mountain View, CA (US); Jagan Rangarajan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 973 days.

(21) Appl. No.: 12/506,308

(22) Filed: Jul. 21, 2009

(65) Prior Publication Data

US 2010/0019431 A1  Jan. 28, 2010

Related U.S. Application Data

(60) Provisional application No. 61/082,607, filed on Jul. 22, 2008.

(51) Int. Cl.
*B23Q 1/06* (2006.01)
(52) U.S. Cl.
USPC .............................................. 269/56; 269/903

(58) Field of Classification Search
USPC .............. 269/56, 55, 60, 903, 900; 29/559
See application file for complete search history.

(56) References Cited

U.S. PATENT DOCUMENTS

| 7,440,091 B2* | 10/2008 | Bagley et al. ............. 356/237.2 |
| 7,880,155 B2* | 2/2011 | Krupyshev et al. ......... 250/559.3 |
| 2007/0128008 A1* | 6/2007 | Morikawa ..................... 414/217 |
| 2007/0290150 A1* | 12/2007 | Krupyshev et al. ...... 250/559.33 |
| 2008/0181752 A1* | 7/2008 | Takahashi et al. ........ 414/222.02 |
| 2009/0024241 A1 | 1/2009 | Rice et al. |
| 2009/0182454 A1 | 7/2009 | Donoso et al. |
| 2010/0228371 A1* | 9/2010 | Takahashi et al. ............ 700/103 |

* cited by examiner

*Primary Examiner* — Lee D Wilson
(74) *Attorney, Agent, or Firm* — Dugan & Dugan, PC

(57) ABSTRACT

In a first aspect, a method of manufacturing a substrate is provided wherein an end effector mounted substrate is attempted to be placed, that is put, onto a substrate support, such as a pedestal or slotted support of a substrate carrier, and the effectiveness of the put is verified by a sensor associated with the end effector. In one embodiment, the verification takes place during the retraction motion of the end effector and is accomplished by sensing the presence, absence, or location of the substrate on the substrate support. The sensor may be a through beam sensor, and may be mounted on, coupled to or otherwise move with the end effector adapted to carry the substrate. Numerous other aspects are described.

20 Claims, 8 Drawing Sheets

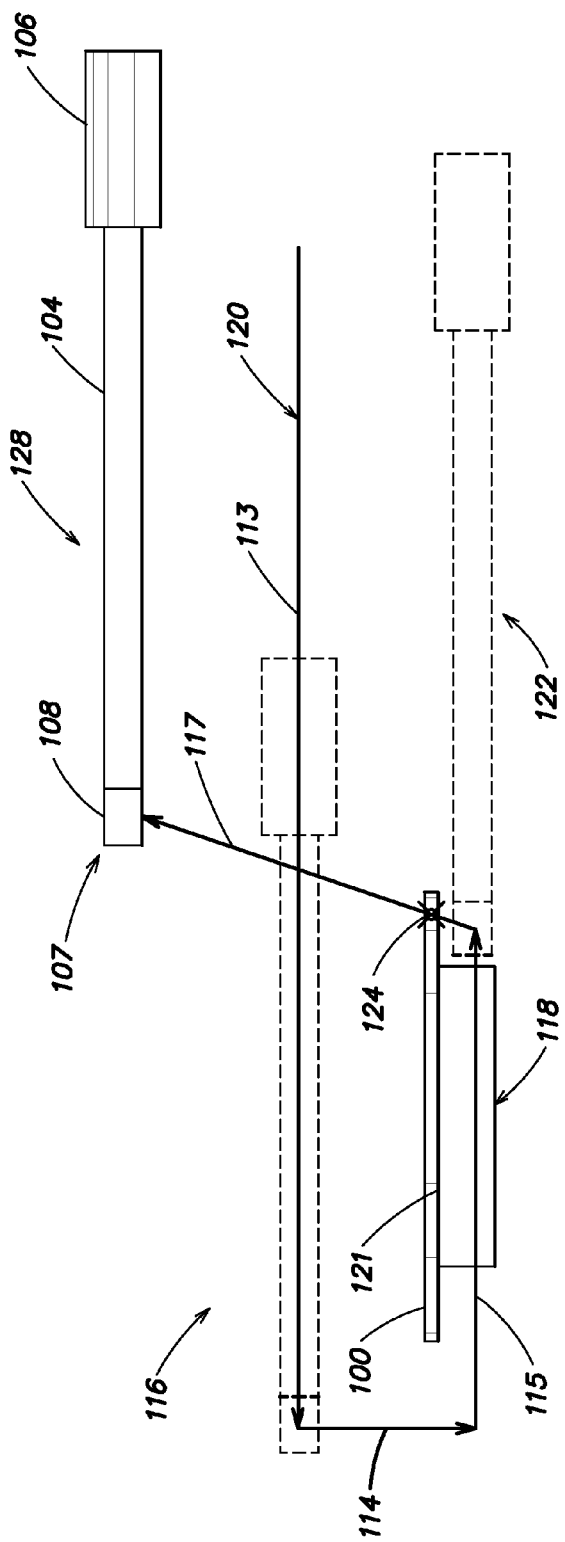
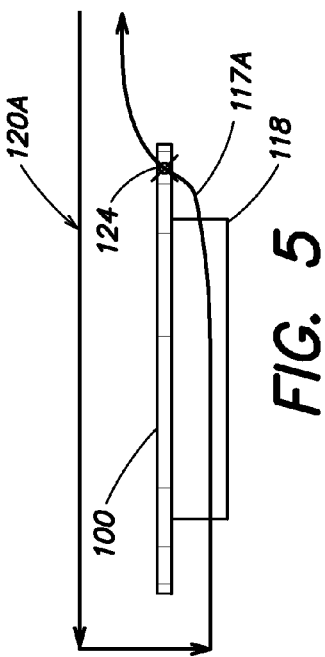

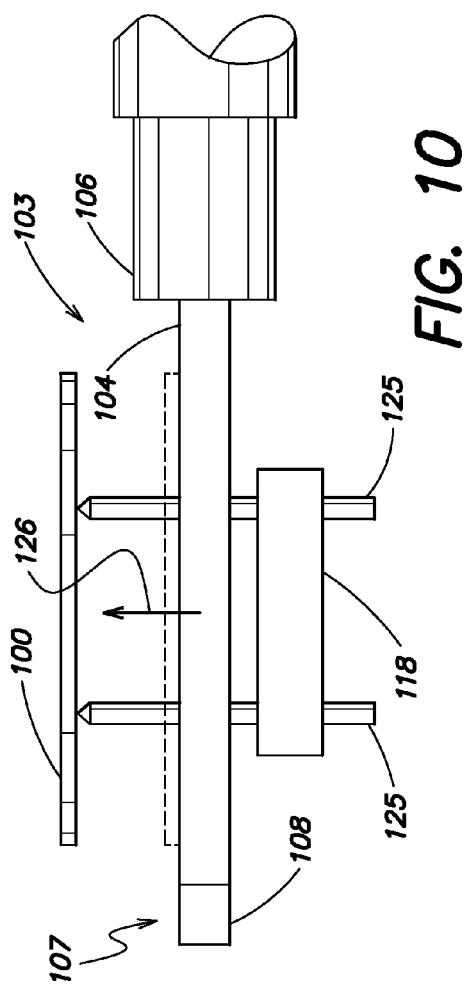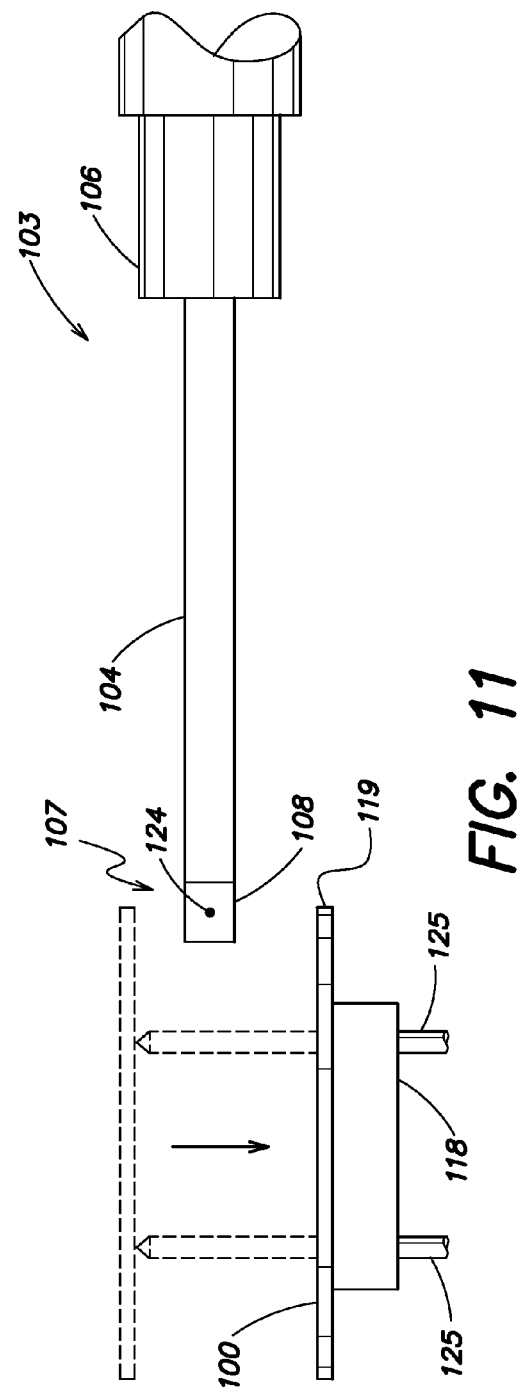

METHODS OF VERIFYING EFFECTIVENESS OF A PUT OF A SUBSTRATE ONTO A SUBSTRATE SUPPORT

RELATED APPLICATIONS

The present application claims priority to U.S. Provisional Patent Application No. 61/082,607 filed Jul. 22, 2008, and entitled "METHODS OF VERIFYING EFFECTIVENESS OF A PUT OF A SUBSTRATE ONTO A SUBSTRATE SUPPORT" which is hereby incorporated herein by reference in its entirety for all purposes.

FIELD OF THE INVENTION

The present invention relates generally to electronic device fabrication methods, and is more particularly directed to the placement of electronic device substrates on substrate supports.

BACKGROUND OF THE INVENTION

In the manufacture of electronic devices, a substrate such as a semiconductor wafer, a glass plate, or a polymer, etc. typically undergoes a sequence of manufacturing or processing steps. These steps may include, for example, polishing, thin film deposition, oxidation or nitration, cleaning, etching, photolithography, and heat treatment, etc. Between processing stations, a substrate may be carried within a substrate carrier. For example, FIG. 1 is a perspective view of a substrate 100 that may be carried within a substrate carrier 102 (e.g., a multi-slot substrate carrier). During the manufacture of such electronic devices, substrate 100 may be transported from the substrate carrier 102 to a substrate support at a processing station (not shown), and after processing is completed within a particular processing station, the substrate 100 may be moved from the processing station back into the same or a different substrate carrier 102. The substrate 100 in the substrate carrier 102 may then be transported to another processing station where additional processing steps may take place on the substrate 100.

During transport of the substrate 100 to the substrate support of the processing station (not shown), and also during return transport of the substrate 100 from the substrate support back to the substrate carrier 102, for example, a robot arm or other automated substrate carrying assembly 103 (FIG. 2), with an attached end effector 104 may carry the substrate 100. For example, during the movement to the processing station, the end effector 104 and substrate 100 may be transported to a location slightly above the substrate support and then lowered to place the substrate 100 onto the substrate support. After the placement of the substrate 100, the end effector 104 may be retracted, and another substrate may be retrieved and placed onto another substrate support, for example. Following completion of processing step(s) at the processing station, the substrate may then be transported to, and placed to rest in, a slotted substrate support of a carrier, such as in the multi-slot carrier 102. Each of these placement operations whereby the substrate 100 is placed onto the substrate support of the processing station or onto the slotted substrate support of a carrier 102, is referred to herein as a "put."

Methods and apparatus for facilitating such puts are desired.

SUMMARY OF THE INVENTION

In a first aspect of the invention, a method of manufacturing a substrate is provided that includes the steps of supporting the substrate with an end effector, attempting to put the substrate onto a substrate support, and verifying the effectiveness of the put with a sensor associated with the end effector.

In a second aspect, the present invention provides a method of manufacturing a substrate that includes the steps of mounting a substrate on an end effector, attempting to position the substrate within a slotted substrate support of a carrier, and, before retrieving another substrate, detecting the substrate within the carrier at a detection location with a sensor associated with the end effector.

In a third aspect, the present invention provides a method of manufacturing a substrate that includes the steps of providing the substrate on an end effector, the end effector including a sensor, separating the substrate from the end effector and positioning the substrate on a substrate support, retracting the end effector along a retraction path, and, during the step of retracting, moving the sensor to a detection location, and detecting the substrate on the substrate support at the detection location.

Numerous other aspects are provided in accordance with these and other aspects of the invention. Other features and aspects of the present invention will become more fully apparent from the following detailed description, the appended claims and the accompanying drawings.

BRIEF DESCRIPTION OF THE DRAWINGS

FIG. 4 is a side view illustrating an exemplary path the end effector may take in order to verify the effectiveness of the put of the substrate on the substrate support;

FIG. 5 is a side view illustrating another exemplary path the end effector may take in accordance with the invention;

FIGS. 10 and 11 are side views illustrating an embodiment wherein the substrate is lifted off from the end effector, the end effector is retracted, and the substrate is then moved past the detection location to detect the substrate.

Figure 1:
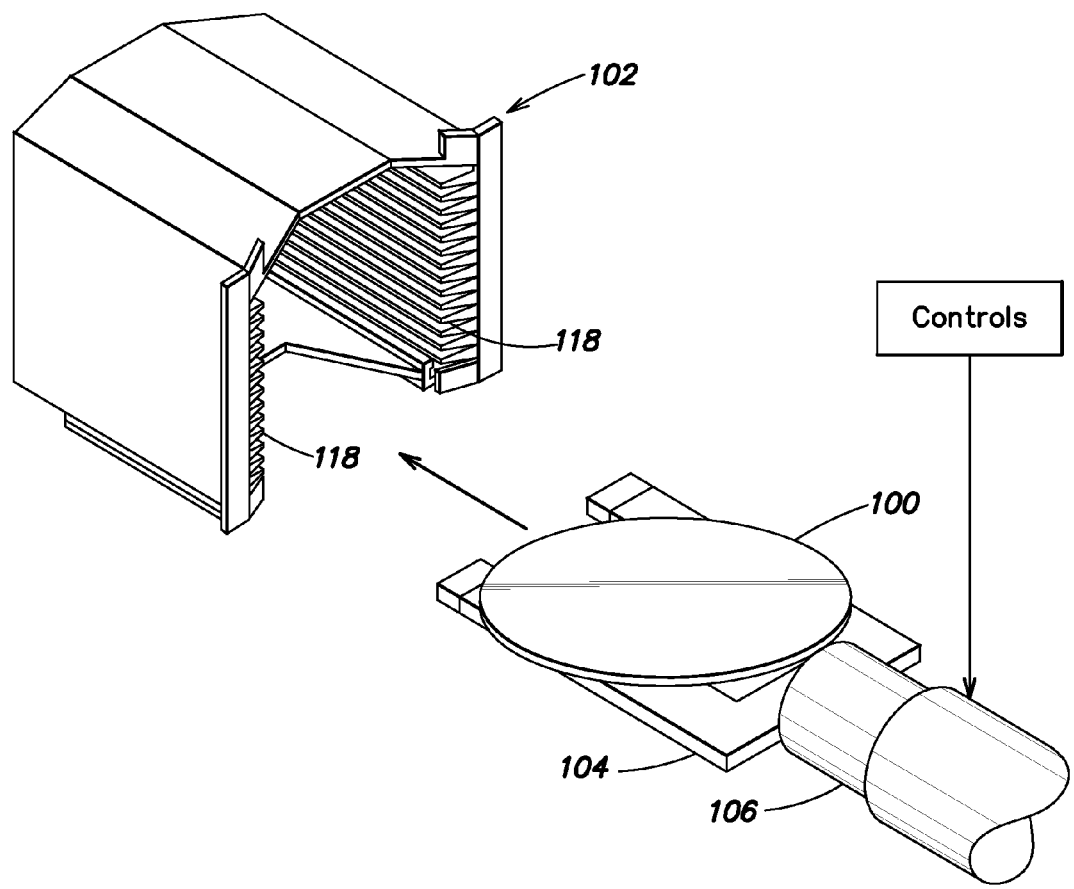
FIG. 1 is a perspective view illustrating a substrate mounted on an end effector of a robot arm and a slotted carrier according to the Prior Art.

The drawings are not necessarily to scale.

DETAILED DESCRIPTION

Broadly, the present invention provides methods used in the manufacture of electronic devices such as integrated circuits, and flat panel displays, etc. More particularly, the invention is directed to the processing of substrates (e.g., semiconductor wafers, glass panels, and polymer substrates, etc.) and the like, from which such electronic devices may be fabricated. In particular, the invention has utility for ensuring the effectiveness of an automated placement (or put) of a substrate onto a substrate support, or the like.

During such a put, it may be possible to improperly place the substrate, possibly due to improper calibration or robot wear. The substrate support may be a support at a processing station (such as a pedestal) or the slotted support 118 of a carrier, such as in the multi-slotted carrier 102 of FIG. 1. For example, after a put by an end effector and during retraction of the end effector, the substrate may be dragged out of a desired placement location on the substrate support by the end effector. In one instance, the robot may drag the substrate entirely off from the substrate support such that the substrate remains on the end effector during a retraction motion. In another instance, the end effector may drag the substrate out of the desired placement location during retraction and drop the substrate. In a third instance, the substrate may simply be improperly positioned on the substrate support, such that its position is at other than a desired placement location. If the substrate remains on the end effector or is dropped, the substrate may be said to be "missing" from the desired placement location. If the substrate is placed on the substrate support, but is not placed in a desired location on the substrate support, the substrate may be said to be "misplaced."

Prior to the present invention, upon such events as, e.g., a missing or misplaced substrate, processing may continue as though the substrate had been properly positioned on the substrate support. Such a continuation of processing may possibly result in scrapped substrates, improper and/or uneven processing, and/or otherwise wasted valuable energy, materials and/or processing time. Accordingly, the inventors have recognized a need to promptly verify the effectiveness of a put after the put attempt. In particular, according to some embodiments, during the verification of the effectiveness of a put, the presence or absence of a substrate at a detection location may be sensed before an end effector is moved to retrieve a next substrate. In some implementations, the sensing may be accomplished by a sensor associated with the end effector carrying the substrate. Accordingly, the present inventive method may detect missing substrates such as those dragged out onto the end effector, or that have been dropped after a failed attempt at a substrate put, as well as misplaced substrates. Additionally, according to further embodiments, the location of the substrate relative to a desired placement location may be determined after the put by a sensor associated with the end effector. The desired placement location is defined as a position where the robot controller and/or system intend(s) or intended to place the substrate, e.g., the desired placement position for proper processing/transport. To this end, the aforementioned problems (misplaced or missing substrates) may be detected and appropriate corrective action or actions may be taken. If it is sensed that a substrate is missing, corrective actions may include: stopping the robot temporarily, picking up a dropped substrate, replacing the substrate on the end effector, placing a different substrate in the desired location, etc. If it is determined that the substrate has simply been misplaced from the desired placement location, a corrective action may include nudging a substrate into the desired placement location. Alternatively, the substrate may be picked up and replaced/repositioned on the substrate support.

Thus, in a first embodiment, according to embodiments of the invention there is provided a method of verifying the effectiveness of a put with a sensor associated with the end effector, before the end effector retrieves another substrate. In particular, the verification may involve sensing the presence or absence of the substrate. In a further embodiment, the location of the substrate on the substrate support may be determined after an attempted put and before the end effector retrieves another substrate. In some embodiments, the step of verifying may occur immediately after the put attempt such that the success or failure of the put can be promptly determined. The verification may occur during an end effector retraction step, such that minimal extra motion of the end effector may be needed to verify the put, and thus minimal extra time may be added to the transport cycle. In addition to possibly preventing improper processing, verifying the put effectiveness with a sensor associated with the end effector may possibly minimize the need for placing positioning sensors and/or other apparatus at the various chambers of the processing stations and/or at other locations.

Figure 2:
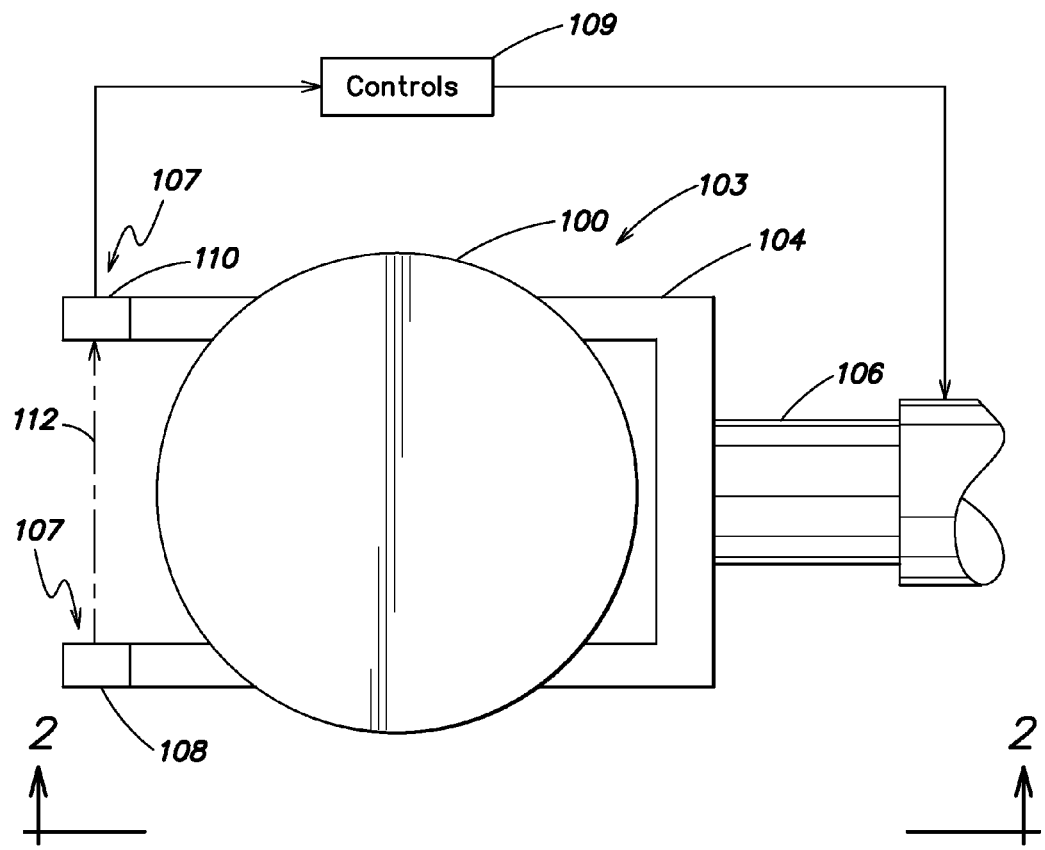
FIG. 2 is a top plan view illustrating the substrate mounted on the end effector of a robot arm.

In the various figures described herein, like numerals denote like elements in the various embodiments. Referring now to FIG. 2, there is schematically shown a top plan view of a substrate carrying assembly 103. The substrate carrying assembly 103 includes an end effector 104, which may have a blade, mounted to a robotic component 106, such as a robot wrist or arm, or other mechanized element which may be controlled by suitable conventional robot controller 109 to move the end effector 104. The remaining robotic arm assembly (not shown) may be any conventional robotic components used to accomplish the movement of the end effector 104. As illustrated, the substrate 100 may be mounted atop the end effector 104 and may rest on the blade of the end effector 104. Associated with the end effector 104 may be a sensor assembly 107. Sensor assembly 107 may be associated with the end effector by being mounted on, coupled to, included within, or otherwise interconnected to so as to move with the end effector 104. In some implementations, the sensor assembly 107 may include a through beam sensor which may be mounted on an outboard distal end of the end effector 104 as shown. The sensor assembly 107 may be coupled to, and move with, the end effector 104 and may include, for example, a sender 108 which emits a beam 112 and a receiver (or sensor) 110 which receives the beam 112. The sensor 110 may be a fiber optic sensor and the beam 112 may be a laser beam, for example, or any other suitable beam which can be effectively used to detect the substrate 100, such as to sense the presence and/or location of the substrate 100 at a detection location. For example, a simple light emitting diode and sensor arrangement may be used. Optionally, any other suitable sensor which may sense the presence or absence of the substrate may be used, such as a photoelectric sensor, a flare type fiber optic sensor, or an ultrasonic through beam sensor, etc.

In operation, if the beam 112 of the sensor assembly 107 is broken or interrupted when the sensor assembly 107 is positioned at a detection location, a signal may then be sent to appropriate robot controller 109 to indicate the presence of the substrate 100 at the detection location, e.g., verifying the effectiveness of the put. The robot controller 109 may then instruct the robot to move on and retrieve another substrate. In the case where no substrate is sensed at the detection location, e.g., the put being ineffective because the substrate 100 is missing or misplaced, a corrective action may be taken. In one corrective action, for example, a control signal from the robot controller 109 to the robot may stop the substrate carrying assembly 103 temporarily, so that the substrate 100 may be removed from the end effector 104, or picked up if the substrate were dropped.

Figure 3:
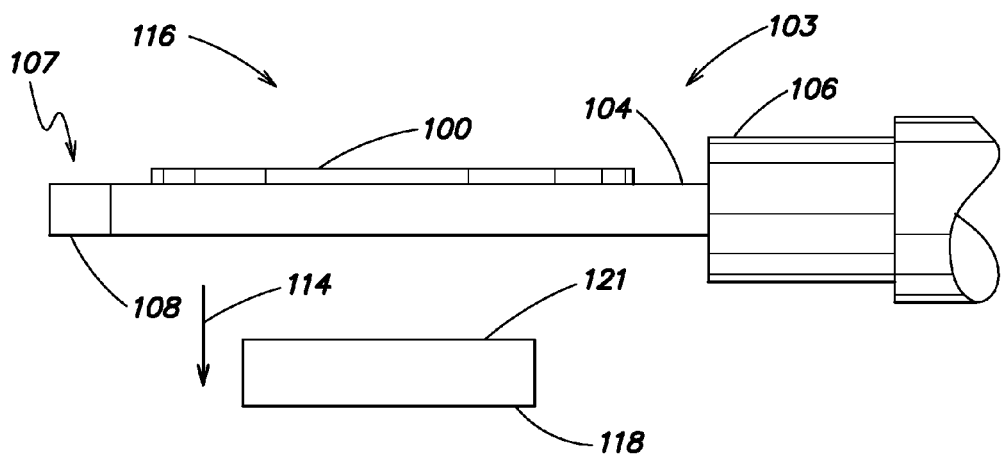
FIG. 3 is a side view illustrating the end effector positioned at a first location above a substrate support.

Referring now to FIG. 3, there is shown in a side view the substrate carrying assembly 103 of FIG. 2 (with the controls not shown for clarity) having the substrate 100 mounted atop the blade of the end effector 104. The end effector 104 is shown positioned at a first location 116 above a substrate support 118 after being transported from, for example, the carrier 102 (FIG. 2) or another processing chamber within the processing station. The substrate support 118 may be a pedestal or other support within the processing station, for example. In a first embodiment, the end effector 104 may be lowered (as indicated by arrow 114) such that the substrate 100 is attempted to be put onto the surface 121 of the substrate support 118. Additionally, and as will be further described herein, the present invention is applicable to verifying the attempted put onto a slotted substrate support 118 of a carrier 102, such as shown in FIG. 1, which may occur after the processing at a processing station is completed.

FIG. 4 illustrates, in greater detail, an exemplary path 120 (designated by the bold line) which may be undertaken by the end effector 104 and the sensor assembly 107 to put the substrate 100 and verify the effectiveness of the put according to a first embodiment. The end effector 104 carrying the substrate 100 may first move along first segment 113 of the path 120 to the first location 116 (shown in dashed line view) above the substrate support 118. Next, the end effector 104 may be lowered during the attempted put along the second segment 114 to a second position below the mounting surface 121 of the substrate support 118. This movement attempts to cause the substrate 100 to be put, e.g., positioned onto the substrate support 118, and separates the substrate 100 from the end effector 104. The support 118 shown is a simple pedestal, but the path 120 may be equally applicable to put the substrate onto a slotted support 118 of a carrier 102 (see FIG. 1), for example. The second position (not shown) may be at a location sufficiently below the substrate to provide an appropriate gap between the end effector 104 and substrate 100 such that the end effector 104 may be effectively retracted along the retraction path without contacting the substrate. After lowering, the end effector 104 may be retracted along a third segment 115 of the path 120 to a third position 122 (shown in dashed line view). Next, the end effector 104 and sensor assembly 107 (FIG. 2) may be further retracted along a fourth segment 117 of the path 120. The fourth segment 117 may include both a vertical and a horizontal motion component, for example, such that the beam of the sensor assembly 107 may be retracted to, and pass through a detection location 124. During the segment 117, the sensing and detecting of the substrate 100, as described above, may be accomplished. Of course, the retraction path shown is exemplary only, and other suitable paths may be employed to retract the sensor assembly 107 associated with the end effector to the detection location 124.

Figure 6:
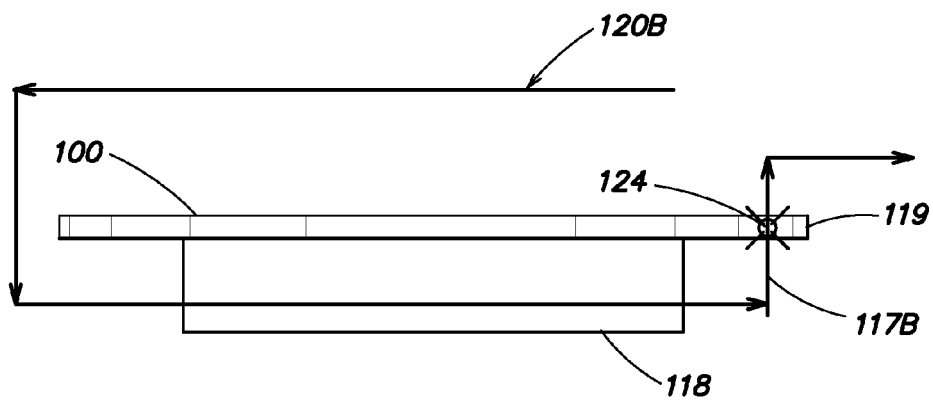
FIG. 6 is a side view illustrating yet another exemplary path the end effector may take in accordance with the invention.

In one alternative embodiment, for example, the transition regions at the beginning and end of segment 117A of the path 120A may be smoothed out as shown in FIG. 5, such that an efficient and smooth retraction through the detection location 124 may take place. This may provide efficient verification of the put with only a limited addition, if any, to overall substrate put time. Optionally, as shown in FIG. 6, the fourth segment 117B of the path 120B may be oriented to be substantially vertical. In each of these retraction paths, the sensing of the substrate may take place at the detection location 124.

The detection location 124 is defined herein as a location in space where the presence of the substrate 100 on the support 118 may be sensed or detected by the sensor assembly 107, if the substrate has been effectively put within a first selected set of location tolerances. This first set of location tolerances may be as simple as that the substrate has not been dragged out of a desired location onto the end effector by the end effector and/or dropped on the floor. The first set of location tolerances may also include whether the substrate has been placed too far into the placement location such that, even though the substrate is not detectable at detection location 124, the substrate may still be located on the substrate support, albeit in a non-optimal position, e.g., outside of a second set of location tolerances, as discussed below. In particular, the detection location 124 may be a location in space, which may be slightly inboard of the expected outer edge 119 of the substrate 100 (if properly placed), where the substrate 100 may be detected. Thus, in accordance with the embodiments of FIGS. 4 through 6, as the end effector 104 is commanded by the robot controller 109 to move the sensor assembly 107 to the detection location 124, the sensor assembly 107 may either: 1) sense the presence of the substrate 100 at the detection location 124, if the beam 112 is broken when the sensor assembly 107 is retracted to the detection location 124, or 2) sense the absence of the substrate 100 at the detection location 124 if the beam 112 is unbroken when the sensor assembly 107 is retracted to the detection location 124. In the case where the absence of a substrate at the detection location 124 is sensed, an error may be determined by the robot controller 109 such that a suitable corrective action may be taken, such as temporarily stopping the end effector 104 at or near location 124, or any other suitable response. It will be understood that detection location 124 may be selected based upon the location information the operator wishes to obtain.

As described above, the verification step may be used to detect not only the presence or absence of the substrate 100 at the detection location 124, which may indicate the placement of the substrate 100 within a first selected set of location tolerances, but also the position of the substrate 100 in relation to a desired placement location. The desired placement location may be the location where the substrate 100 is located if placement is acceptable or perfect, e.g., within a second set of location tolerances which are more stringent than the first set of location tolerances. For example, in FIG. 7, the path 120C includes a retraction path that further includes a re-approach path, which may include raising the sensor assembly 107 to a location in line with the plane of the desired substrate location, and in front of the substrate 100, and then moving the sensor assembly 107 (FIG. 2) toward the desired placement location of the substrate until the edge 119 of the substrate 100 is sensed. If the beam of the sensor assembly 107 is broken prematurely, e.g., at a location at which the substrate would not be present if the substrate were properly placed, this may be indicative of a misplaced substrate 100. The corrective action may then be to nudge the substrate a distance "x" equal to the difference between the actual and desired placement locations, such that the substrate 100 is finally positioned at the desired placement location after the nudge. After this corrective action, another substrate may be retrieved.

Figure 7:
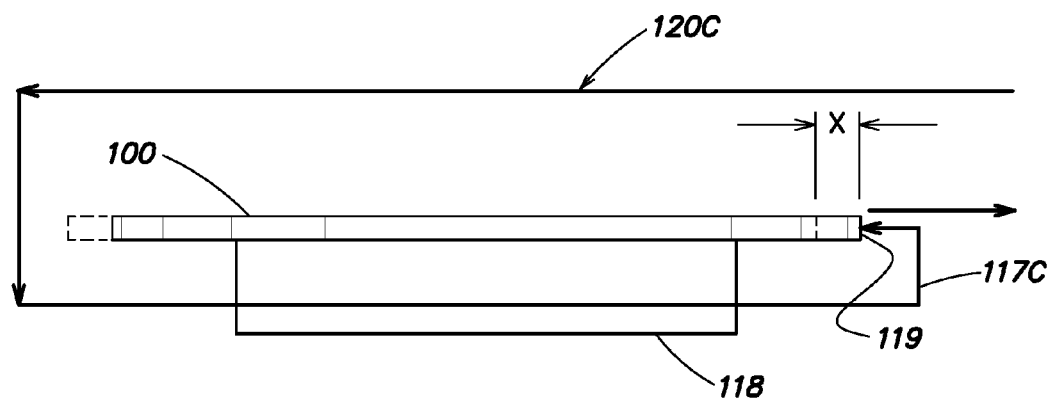
FIG. 7 is a side view illustrating an exemplary path the end effector may take to determine the location of the substrate in accordance with the invention.

In yet another embodiment, the sensor assembly 107 may be retracted along any of the paths described in FIGS. 4-6, or along any other suitable path which would enable the sensor assembly to determine the presence or absence of the substrate at the detection location 124. This retraction motion may then be followed by the sensor assembly 107 re-approaching the substrate (such as, for example, as depicted in FIG. 7), in order to determine the location of the substrate 100.

Figure 8:
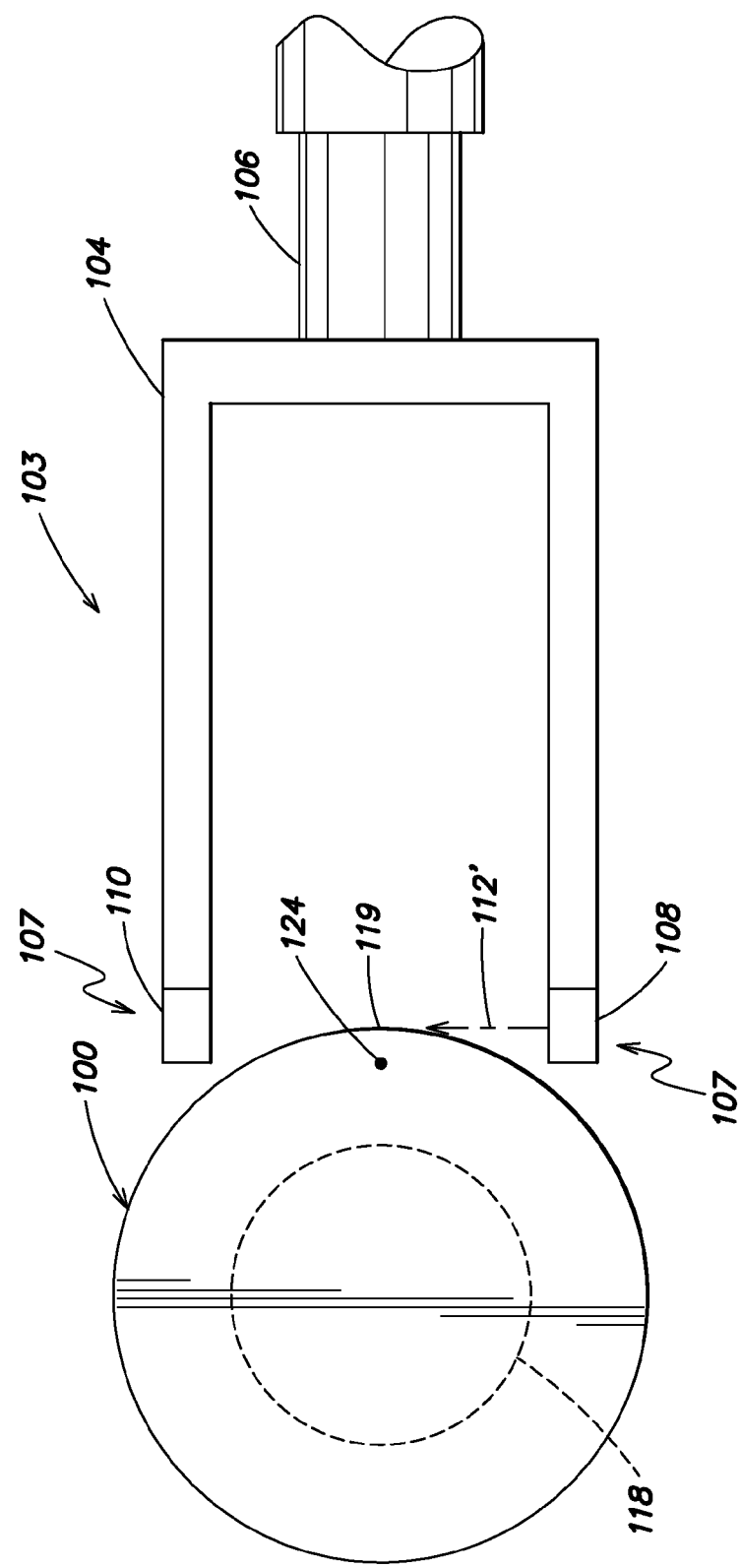
FIG. 8 is a top plan view illustrating an exemplary position of the end effector and through beam sensor at the detection location.

Now referring to FIG. 8, there is shown a top plan view of the end effector 104 with the sensor assembly 107 positioned at the detection location 124. As the end effector 104 is moved along a retraction path as described with reference to FIGS. 4-7, the beam becomes aligned with, and positioned at, the detection location 124. According to some embodiments, the beam 112' may be oriented in a generally parallel relationship with a surface plane of the substrate 100. As described, the beam 112' will be broken if the substrate 100 is present on the support 118. This may indicate a successful put. The detection may be accomplished without contact between the sensor assembly 107 and the substrate 100, as shown in FIG. 8 or optionally with only slight contact therewith, e.g., with a slight lifting motion. This view also illustrates how the location of the edge 119 of the substrate 100 may be determined.

Figure 9:
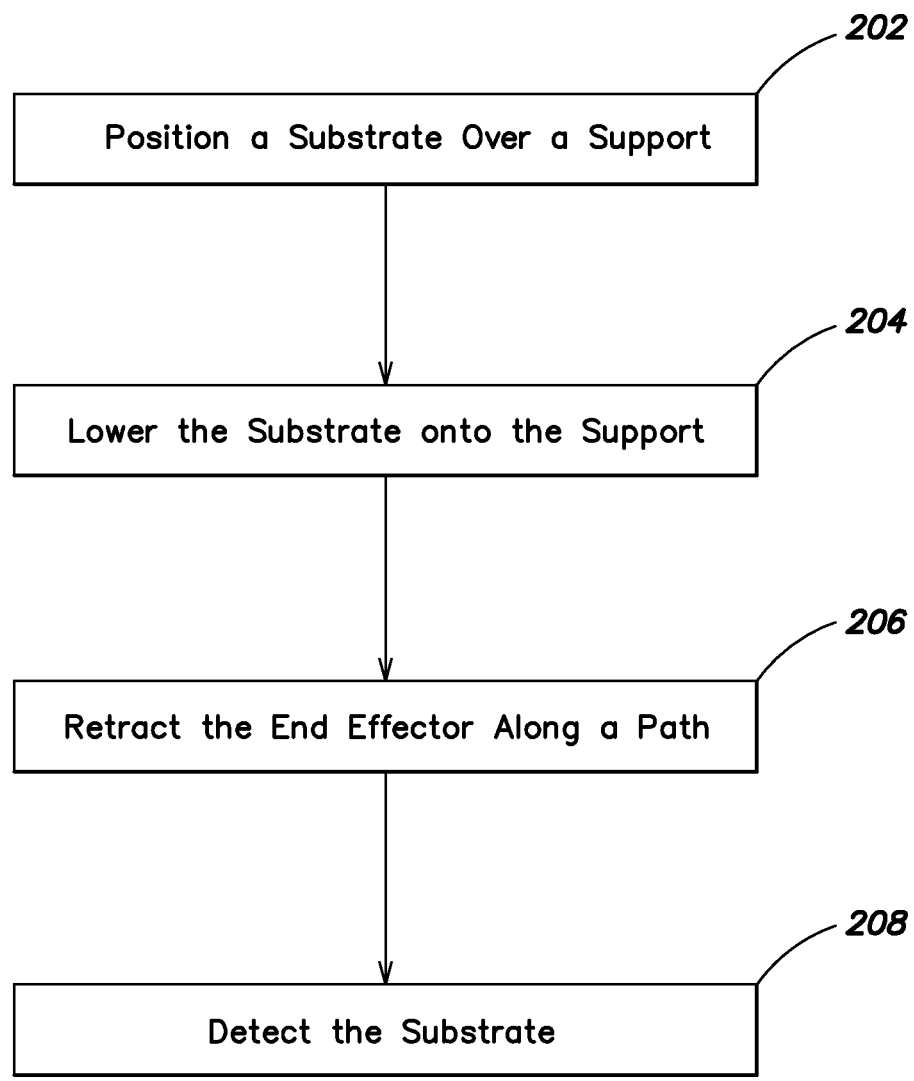
FIG. 9 is a process step flowchart illustrating various process steps according to embodiments of the invention.

For further clarity, a flowchart is shown in FIG. 9 which outlines the process steps in the first embodiment of the invention. First the substrate 100 is positioned over the substrate support as in step 202. Next the substrate 100 is placed on the support by lowering the end effector as shown in step 204. Thereafter, as shown in step 206, the end effector is retracted along a retraction path wherein the sensor assembly associated with the end effector is moved via a suitable robot controller to the detection position located in a plane of the substrate. Finally, in step 208, the substrate is detected, or not, by the end effector sensor assembly. In particular, as described above, the detection may include detecting the presence, absence, or location of the substrate. Step 208 may be followed by the taking of a corrective action (not shown).

Another exemplary embodiment of the invention is shown and described with reference to FIGS. 10 to 12. In this embodiment, as shown in FIGS. 10 and 11, the substrate 100 may be positioned over the support 118 by the end effector 104. However, in this embodiment, instead of lowering the end effector to place the substrate 100 on the pedestal, the substrate 100 may be lifted by a position-controlling mechanism, such as by lift pins 125. Any suitable position-controlling mechanism may be used. The substrate 100 is thus lifted and separated from the end effector 104. As shown, the lifting is designated by arrow 126. Next, the end effector 104 may be retracted such that the sensor assembly 107 (FIG. 11) is positioned at the detection location 124 (designated as a dot) where the presence or absence of the substrate 100 may be detected. As in the previous embodiment, a good location for detection is near an anticipated location of an outer edge 119 of the substrate 100 as the substrate passes by the end effector 104. Next, the substrate 100 may be moved, e.g., lowered past the through beam 112 of sensor assembly 107 associated with the end effector 104. By moving through a substantially horizontal plane which includes the detection location 124, and passing the tops of pins 125 (including the substrate 100, if it is properly placed), the presence or absence of the substrate may be detected.

Figure 12:
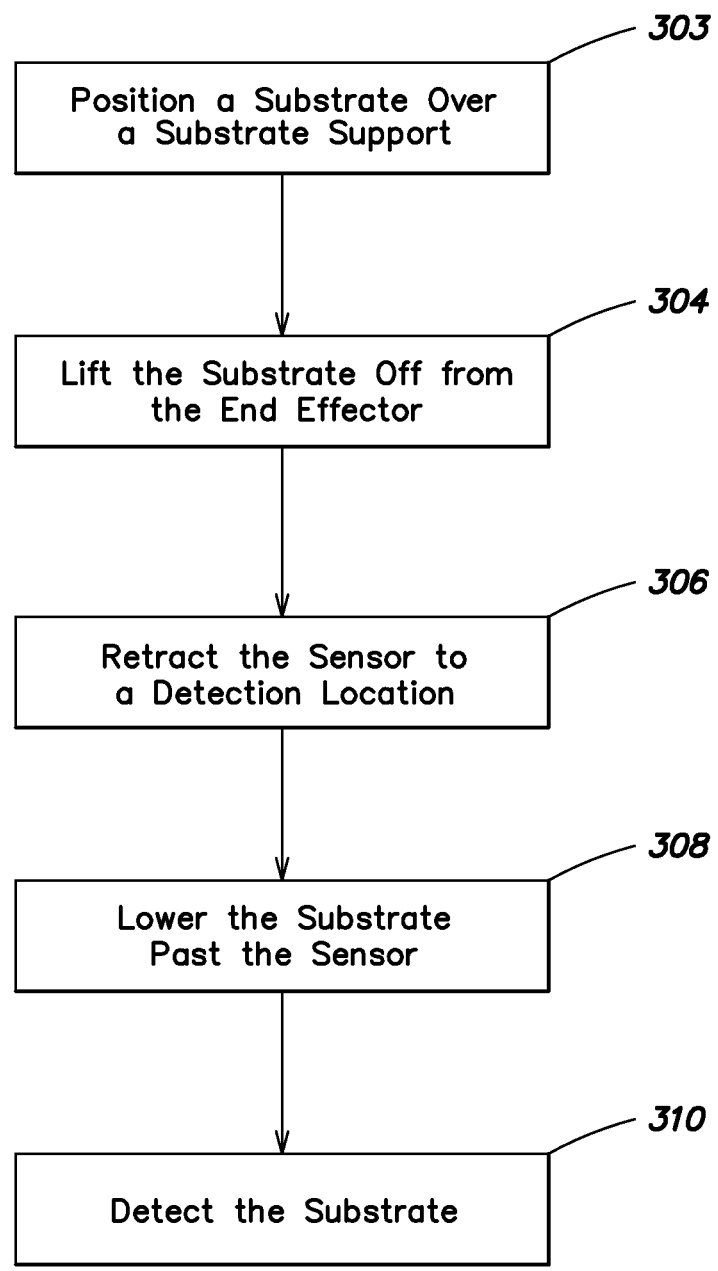
FIG. 12 is a process step flowchart illustrating various process steps according to additional embodiments of the invention.

FIG. 12 outlines the method steps taken for this embodiment of the invention. First, the substrate 100 is positioned over the substrate support in step 302. Next the substrate is lifted off from the end effector, such as by lift pins 125 or the like in step 304. The end effector is then retracted along a retraction path to position the beam of the associated sensor assembly 107 at the detection location 124 in step 306. Next, the substrate, if properly positioned, is lowered in step 308 past (and through) the sensor beam located at the detection location whereby the substrate is detected in step 310.

In additional embodiments of the invention as depicted in FIGS. 10 and 11, the placement location of the substrate on the substrate support may be detected according to further embodiments of the invention by retracting the end effector to position the sensor assembly slightly further away from the expected substrate edge. Then, during the step of lowering, the lift pins may be stopped at a vertical position whereby the substrate is level with the beam of the sensor assembly. Then the sensors may be moved horizontally towards the edge of the substrate until the edge is detected, similar to the path shown in FIG. 7. Accordingly, the location of the substrate on the pins may be detected, and, if the substrate is misplaced from the desired placement location, the substrate may be nudged by the end effector into the desired location. Any suitable method may be used to nudge or re-place the substrate on the substrate support.

Accordingly, while the present invention has been disclosed in connection with the exemplary embodiments, it should be understood that other embodiments may fall within the scope of the invention as defined by the following claims. For example, any suitable sensor may be employed which can sense the presence of the substrate after the put. Similarly, any type of end effector may be employed for carrying the substrate, including gripper or suction type, for example.

The invention claimed is:

1. A method of manufacturing a substrate, comprising the steps of:
   providing the substrate on an end effector,
   attempting to put the substrate on a substrate support, and
   verifying the effectiveness of the put with a sensor associated with the end effector, wherein the sensor is associated with the end effector by being mounted on, coupled to, included within, or otherwise interconnected to the end effector so as to move with the end effector.

2. The method of claim 1 wherein the step of verifying further comprises sensing with the sensor the presence or absence of the substrate at a detection location.

3. The method of claim 1 wherein the step of verifying further comprises retracting the end effector along a retraction path and, during the retraction, sensing the substrate with the sensor at a detection location.

4. The method of claim 1 wherein the step of verifying further comprises moving the sensor to a detection location.

5. The method of claim 1, further comprising the steps of:
   carrying the substrate on the end effector,
   moving the end effector and substrate to a first location above the substrate support,
   lowering the end effector during the step of attempting, and
   retracting the sensor to a detection location.

6. The method of claim 1, further comprising the steps of:
   carrying the substrate on the end effector,
   lifting the substrate off from the end effector,
   retracting the sensor to a detection location, and
   moving the substrate through the detection location.

7. The method of claim 1 wherein during the step of verifying, the substrate or the sensor is moved along a retraction path including a detection location.

8. The method of claim 1 wherein the step of verifying includes retracting the sensor along a retraction path and sensing the presence, absence or location of the substrate during the retraction.

9. The method of claim 8 wherein the step of retracting includes moving the sensor to the detection location with a motion including a vertical motion component and a horizontal motion component.

10. The method of claim 1 wherein the step of verifying includes moving a beam of the sensor to a detection location.

11. The method of claim 10 wherein the beam of the sensor is oriented parallel to a surface plane of the substrate during the step of verifying.

12. The method of claim 10 wherein the step of verifying comprises moving the substrate past the sensor positioned at the detection location.

13. The method of claim 1, wherein the step of verifying the effectiveness comprises determining a location of the substrate with the sensor.

14. The method of claim 1 wherein the step of verifying takes place before another substrate is retrieved.

15. The method of claim 1, further comprising moving the end effector carrying the substrate to a first location above the substrate support, lifting the substrate off from the end effector, retracting the sensor to a detection location, and moving the substrate to cause the substrate, if properly positioned, to pass through the detection location.

16. The method of claim 1 wherein the step of verifying includes sensing the presence of the substrate at a location inboard of an edge of the substrate.

17. The method of claim 1 wherein the step of verifying occurs immediately after the step of attempting to put.

18. The method of claim 1 wherein the substrate support comprises a slotted support of a substrate carrier.

19. A method of manufacturing a substrate, comprising the steps of:
 mounting the substrate on an end effector,
 attempting to position the substrate on a slotted support of a substrate carrier and, before retrieving another substrate, and
 detecting the substrate within the substrate carrier at a detection location with a sensor associated with the end effector, wherein the sensor is associated with the end effector by being mounted on, coupled to, included within, or otherwise interconnected to the end effector so as to move with the end effector.

20. A method of manufacturing a substrate, comprising the steps of:
 providing the substrate on an end effector, the end effector including a sensor within the end effector,
 separating the substrate from the end effector and positioning the substrate on a substrate support,
 retracting the end effector along a retraction path and, during the retraction, moving the sensor to a detection location, and
 detecting the substrate on the substrate support at the detection location.

* * * * *